United States Patent [19]

Kieser

[11] Patent Number: 4,981,839
[45] Date of Patent: Jan. 1, 1991

[54] METHOD OF FORMING SUPERCONDUCTING OXIDE FILMS USING ZONE ANNEALING

[75] Inventor: Joerg Kieser, Forchheim, Fed. Rep. of Germany

[73] Assignee: Siemens Aktiengesellschaft, Berlin & Munich, Fed. Rep. of Germany

[21] Appl. No.: 312,031

[22] Filed: Feb. 17, 1989

[30] Foreign Application Priority Data

Feb. 26, 1988 [DE] Fed. Rep. of Germany ....... 3806078

[51] Int. Cl.$^5$ .......................... B05D 5/12; C30B 1/08
[52] U.S. Cl. ......................................... 505/1; 505/742; 505/725; 427/62; 427/372.2; 219/429; 156/603
[58] Field of Search ........................ 427/62, 63, 372.2; 505/1, 742, 731, 732, 734; 219/429; 156/603, 620.71, 620.75

[56] References Cited

U.S. PATENT DOCUMENTS

| | | | |
|---|---|---|---|
| 4,046,618 | 9/1977 | Chaudhari et al. | 156/603 |
| 4,086,424 | 4/1978 | Mellen, Sr. | 13/24 |
| 4,504,453 | 3/1985 | Tanaka et al. | 423/345 |

OTHER PUBLICATIONS

EPO Standard Search Report; European Patent Office, VPA 88 P 3077 DE; 10/17/88.
Beyers, R. "Annealing Treatment Effects on Structure and Superconductivity in $Y_1Ba_2Cu_3O_{9-x}$"; Appl. Phys. Lett. 51(8) Aug. 24, 1987; pp. 614–616.
Laibowitz, R. B. "Fabrication and Properties of Thin Superconducting Oxide Films"; Physical vol. 148 B+C(13) (1987).
Chaudhari, P. "Critical Current Measurements in Epitaxial Films of $YBa_2Cu_3O_{7-x}$ Compound"; Physical Review Letters (vol. 58 No. 25, Jun. 22, 1987) pp. 2684–2686.
Capponi, J. J. "Structure of the 100 K Superconductor $Ba_2YCu_3O_7$ between (5–300) K by Neutron Powder Diffraction"; Europhysics Letters (vol. 3 No. 12, Jun. 15, 1987) pp. 1301–1307.
Hong, M. "Superconducting Y–Ba–Cu–O Oxide films by Sputtering"; Appl. Phys. Lett, 51(9), Aug. 31, 1987, pp. 694–696.
Izvestija Akademii Neuk SSSR, Ser. Fiz. 39, 5 (1975) pp. 1080–1083.
Superconductivity News Supplement, "A New Class of Superconductors"; vol. 1, No. 3, Feb. 1988, pp. 1–4.
Ogushi, T. "Possibility of Superconductivity with High Tc in La–Sr–Nb–O System"; Journal of Low Temperature Physics, vol. 69, Nos. 5/6, 1987; pp. 451–456.

Primary Examiner—Norman Morgenstern
Assistant Examiner—Roy V. King
Attorney, Agent, or Firm—Kenyon & Kenyon

[57] ABSTRACT

A method for producing a metal-oxidic superconductor material with a high transition temperature and an increased critical current density. The method comprises applying a layer of a metal-oxidic preliminary product comprising the components of the metal-oxidic material, with a crystal structure still having faults, to a substrate, and subsequently, forming the desired superconducting metal-oxide phase by means of a heat and oxygen treatment, where a critical current density of the layer is greater parallel to the surface of the layer than in the direction of the normal of the layer, and wherein the preliminary product is moved through a heated zone parallel to the surface of the layer at a predetermined velocity, wherein the zone has a positive maximum temperature gradient ($\Delta T/\Delta x$) measured in the direction of motion, of at least 5 K/mm and preferably of at least 10 to 50 K/mm.

15 Claims, 1 Drawing Sheet

METHOD OF FORMING SUPERCONDUCTING OXIDE FILMS USING ZONE ANNEALING

FIELD OF THE INVENTION

The invention relates to a method for producing a layer of a metal-oxidic super-conductor material with a high transition temperature and an increased critical current density. More particularly, a layer of a metal-oxidic preliminary product, having a crystal structure still containing faults with respect to the superconducting metal-oxide phase to be developed, is applied to a substrate; and, subsequently, the desired superconducting metal-oxide phase, with an at least partially ordered crystal structure, is formed by means of a heat and oxygen treatment. The crystal structure thereby formed is anisotropic and causes a critical current density of the layer which is greater parallel to the surface of the layer than in the direction of the normal of the layer. Such a method can be found, for instance, in "Physical Review Letters" (Vol. 8, No. 25, June 22, 1987, pages 2684 to 2686); the disclosure of which is hereby incorporated by reference. The invention further relates to an apparatus for carrying out this method.

BACKGROUND

Superconducting metal-oxide compounds with a high transition temperature ($T_c$) of, for instance, above 90 K, are generally known. These metal-oxide compounds are based particularly on a material system Me1-Me2-Cu-O, where the component Me1 comprises at least a rare earth metal including yttrium, and the component Me2 comprises at least an alkaline earth metal. Films or thin layers of these metal-oxide compounds are frequently produced by special vapor deposition or sputtering processes. In these processes a polycrystalline or amorphous preliminary product with the components of the chosen material system is first deposited on a suitable substrate. Generally, at this stage, the oxygen content is not adjusted exactly. This preliminary product is subsequently changed into the material with the desired super-conducting phase by means of a heat and oxygen treatment.

The metal-oxide phases which can be obtained in this manner, have a crystal structure similar to those of a perowskite and, in the case of $YBa_2Cu_3O_{7-x}$, with $0 < x < 0.5$, an orthorhombic structure (see, for instance, "Europhysics Letters" (Vol 3, No. 12, June 15, 1987, pages 1301 to 1307); the disclosure of which is hereby incorporated by reference). Since the materials having these superconducting phases must be counted among the oxide ceramics, the corresponding high-$T_c$ superconductors are frequently called oxide ceramic superconductors.

Generally, single-crystal films of the system $YBa_2Cu_3O_{7-x}$ are produced by means of epitaxy on a monocrystalline $SrTiO_3$ substrate. (See, for instance, "Physical Review Letters", Id.). On this substrate, which have an ordered crystal structure, and have a temperature of about 400° C., the three metallic components are vapor-deposited from separate evaporation sources in an oxygen atmosphere, maintaining the desired stoichiometry. The preliminary product obtained in this manner, however, still has faults with respect to the desired superconducting high-$T_c$ phase. By means of a subsequent heat treatment, at a temperature of about 800° to about 900° C., while oxygen is being supplied, epitaxially grown monocrystalline, or at least strongly textured, film layers, with a desired superconducting high-$T_c$ phase, are obtained. Because of the strongly anisotropic crystal structure of this phase, the film layers so obtained also have anisotropic critical current densities ($J_c$) The critical current density parallel to the surface of the respective layer is substantially higher than the critical current density in the direction of the normal of the layer and can be more than $10^5$ A/cm$^2$ at 77 K. The aforementioned epitaxy is considered a necessary condition for reaching such high critical current densities. With this method, however, the cost of producing such layers is substantial. In addition, the epitaxy proceeding in the high-temperature process is difficult to control, since misoriented grains are frequently generated. These misoriented grains have an adverse effect on the superconducting properties, in particular the critical current density.

Besides the aforementioned vapor deposition technique, corresponding sputtering techniques, in which the sputtering on a substrate takes place from a target which contains at least the three metallic components of the material system, are also utilized (see, for instance, "Applied Physics Letters" (Vol. 51, No. 9, Aug. 31, 1987, pages 694 to 696; the disclosure of which is hereby incorporated by reference)). With the sputtering technique oxygen loading of the preliminary product at elevated temperature is also necessary.

Thus, in all generally known methods for producing thin layers of the high-$T_c$ superconducting material on specific substrates, higher critical current densities (above $10^4$ A/cm$^2$), can be obtained only at considerable cost. These generally known methods are also difficult to reproduce.

The present invention, however, provides a solution to these problems, and allows high-$T_c$ superconducting layers with higher critical current densities (above $10^4$ A/cm$^2$) to be produced, reproducibly, in a relatively simple manner.

SUMMARY OF THE INVENTION

According to the present invention, in the method for producing a layer of a metal-oxidic super-conductor material with a high transition temperature comprising applying a layer of a metal-oxidic preliminary product to a substrate and subsequently forming the desired superconducting metal-oxide phase, with an at least partially ordered crystal structure, by means of a heat and oxygen treatment, this problem is solved by the provision that the preliminary product is moved at a predetermined velocity through a heated zone parallel to the surface of the layer, to develop a maximum positive temperature gradient of at least 5 K/mm measured in the direction of motion.

The invention is based on the insight that the development of a desired anisotropic crystal structure in the direction of the desired current conduction is promoted with a temperature gradient field travelling through the layer parallel to its surface. The result of this temperature gradient field is a correspondingly improved critical current density (current carrying capacity) in the direction of travel of the field. In addition, the measures according to the invention are suited particularly well for the continuous production of elongated bodies such as conductors which are coated with a superconducting high-$T_c$ material.

The apparatus for carrying out the method according to the invention is characterized by the feature that, for the formation of the heated zone with a temperature gradient, a heating device is provided which comprises at least two heating zones with different temperature levels, arranged in tandem, where the trailing region, as seen in the direction of motion, is at the higher temperature level. Since the cost for forming suitable heating devices is relatively low, the desired improvement of the critical current density in coated substrates can be achieved relatively simply.

DETAILED DESCRIPTION OF THE INVENTION

Figure 1:
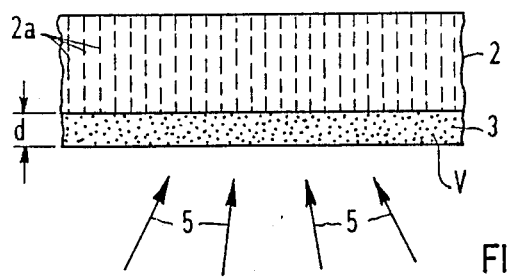
FIG. 1 shows the build-up of a layer treated in accordance with the invention.

In the method according to the invention, one starts from at least one thin layer or at least one film of a known superconducting high-$T_c$ material on a substrate. Such oxide-ceramic materials have an anisotropic crystal structure which is accompanied by a corresponding anisotropy of the critical current density. It is assumed in the following that the maximum critical current density is to be obtained parallel to the surface of the substrate or the layer deposited thereon, particularly in the case of materials with the composition Me1- Me2-Cu-0 which form the basis of the further discussion. A corresponding material which will guarantee a current-carrying capacity on the order of at least $10^4$ A/cm$^2$, at temperatures in the vicinity of the transition temperature $T_c$ of the material, will therefore be assumed for the layer on the substrate. Starting materials Me1 and Me2 can be chosen from the group of rare earth metals, such as Y or La, or from the group of earth alkali metals such as Sr or Ba, respectively. Besides Y or La, materials suitable for Me1 are generally known. However, the corresponding metallic components of the system Me1-Me2-Cu-0 should contain always at least one (chemical) element from the mentioned groups or consist of this one element. Preferably Me1 and Me2 are present in elemental form. Optionally, however, alloys, or compounds, or other compositions of these metals, with substitution materials, are suitable as starting materials; i.e., at least one of the mentioned elements can be partially substituted by another element in a manner known to those of ordinary skill in the art. Thus, for instance, the metallic components Me1 and Me2 can be partially replaced by another metal from the group of metals provided for these components. Also, the copper or the oxygen of the system can be partially substituted for instance, by F.

Besides the mentioned superconducting material, other superconducting high-$T_c$ materials, which exhibit a pronounced anisotropy with respect to their crystal structure and their critical current density, are equally well suited for the method of the present invention. Corresponding materials on the basis of the material system Bi-Sr-Ca-Cu-0 are known, for instance, from "Superconductivity News Supplement" (Vol. 1, No. 3, February 1988), the disclosure of which is hereby incorporated by reference; or on the basis of the material system La-Sr-Nb-O from "Journal of Low-Temperature Physics" (Vol. 69, Nos. 5/6, 1987, pages 451 to 457), the disclosure of which is hereby incorporated by reference (see also "The Japan Times" of Jan. 21, 1988; the disclosure of which is hereby incorporated by reference). Advantageous materials for the substrate include those which exhibit a perowskite-like structure, where their unit cells have dimensions which are approximately at least one to several times the corresponding dimension of the axes of the structures of the superconductive high-$T_c$ material grown on the substrate. For this reason, a monocrystalline SrTiO$_3$ or (Ba, Sr)TiO$_3$ substrate is particularly advantageous in the case of YBa$_2$Cu$_3$O$_{7-x}$. Such textured substrates are generally known (see, for instance, "Izvestija Akademii Nauk SSSR" (Ser. Fiz., Vol., 39, No. 5, May 1975, pages 1080 to 1083); the disclosure of which is hereby incorporated by reference).

The method according to the invention, however, is not limited to such monocrystalline substrates. Polycrystalline substrates such as polycrystalline SrTiO$_3$ vapor deposited on a carrier can optionally be utilized. Besides the mentioned substrate materials, other known materials are suitable such as MgO, Al$_2$O$_3$, Y-stabilized ZrO$_2$ or Ta$_2$O$_5$. The substrate can be provided with a relatively small area, for instance, for use in the field of microtechnology. The substrate, however, may also be an elongated body, which has the form of a ribbon, or also may have a circular wall or circular ring cross section, and thereby serves for preparing suitable conductors.

EXAMPLE

As an example of one embodiment of the present invention, the preparation of a layer consisting of a superconducting material of the known composition YBa$_2$Cu$_3$O$_{7-x}$, having an orthorhombic structure as shown in FIG. 1, will be illustrated. This layer is to be formed on a SrTiO$_3$ substrate, 2, with an ordered structure, particularly on monocrystalline SrTiO$_3$. In the figure, such a texture of the substrate is indicated by dashed lines 2a.

First, a thin layer, 3, of Y-Ba-Cu-0 with a still random structure (disordered structure) is deposited on substrate, 2, in a manner such as those generally known in the art. For instance, the metallic components Y, Ba, Cu, of the material system can be applied in a PVD (physical vapor deposition) process, such as by sputtering-on by means of a magnetron, up to a maximum layer thickness of less than 100 $\mu$m and preferably less than 10 $\mu$m. For producing a sputter layer 3, a d-c voltage low-pressure plasma in an Ar or Ar/O$_2$ atmosphere can be used. In this plasma, ions are generated which impinge on a cathode. In the process, they atomize the cathode material which consists of a ceramic of the chosen system Y-Ba-Cu-0. In this ceramic, at least the three metallic components of the system should be present in the stoichiometric ratio of the design superconducting high-$T_c$ phase. The cathode material atomized in this manner is then precipitated as neutral particles 5, or as ions on the substrate 3. The substrate 3 can optionally be kept at an elevated temperature level. Such deposition systems are generally known. The individual process parameters for the deposition such as the pressure and the deposition rate are adjusted so that a layer up to the aforementioned layer thickness is gradually grown on the substrate. At the end of the deposition process a still random preliminary Y-Ba-Cu-0 product, V, of the superconducting material to be produced, is present. This preliminary product still has a fault structure with respect to the desired orthorhombic high-$T_c$ phase. The preliminary product V is generally amorphous or polycrystalline.

In addition to the above-described sputtering-on, other PVD processes such as reactive, RF-aided laser evaporation, or vapor depositions by means of three separate electron beam sources, are possible while oxygen is simultaneously supplied as a gas or an ion stream (see, for instance, the publication "Phys. Rev. Lett.", Id.). Likewise, chemical methods such as CVD (chemical vapor deposition) are suitable for depositing the layer of the still random, preliminary product.

Figure 2:
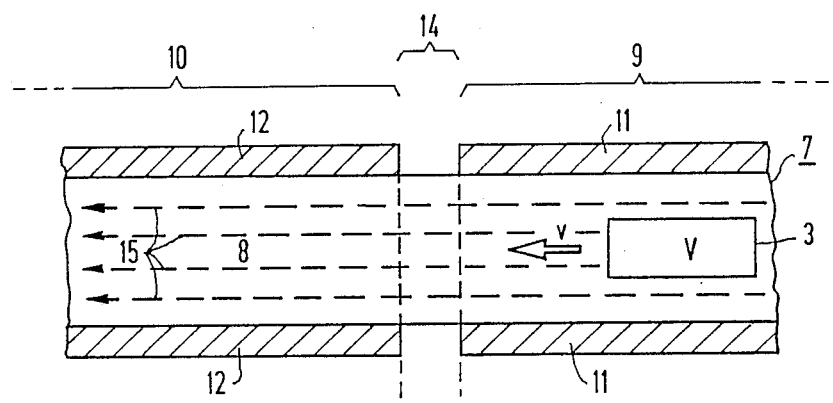
FIG. 2 shows schematically an apparatus for carrying out the method according to the invention.
Figure 3:
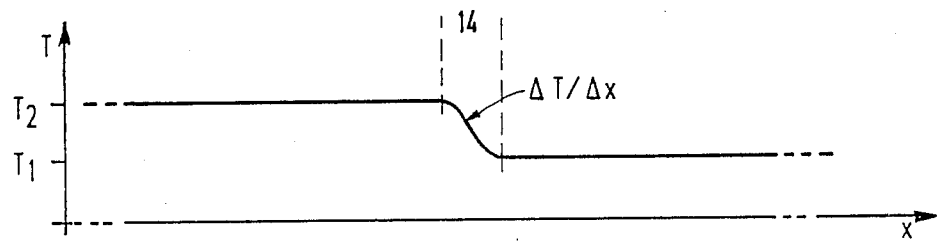
FIG. 3 graphically depicts the temperature gradient created in the apparatus shown in FIG. 2.

The preliminary product, made in the aforementioned manner, is then subjected to a temperature (annealing) and oxygen treatment. According to the present invention, the preliminary product is moved through a heated zone which is already at an elevated temperature level, to form a predetermined temperature gradient. This purpose can advantageously be served by the heating device indicated in FIG. 2, which provides for a continuous heat treatment of elongated bodies such as conductors. This device, generally designated 7 comprises a tubular working zone 8, through which the preliminary product V or the substrate 3, coated with this preliminary product, can be conducted at a predetermined velocity v. The direction of motion is parallel to the surface of the substrate 3 or the preliminary product V. The working range has at least two heating zones 9 and 10, which are at different temperature levels $T_1$ and $T_2$, and which are disposed one behind the other as seen in the direction of motion. The second or following zone 10 (in the direction of motion) should be at the higher temperature level $T_2$ The temperature difference between the two heating zones 9 and 10 should be at least about 200° C. In the case of the chosen Y-Ba-Cu-O material, the temperature level $T_1$ of the first heating zone is preferably between about 350° C. and about 550° C. and most preferably between about 400° C. and about 500° C., while the following heating zone 10 is kept at a temperature level $T_2$ preferably above about 650° C. and most preferably above about 750° C., for instance, between about 900° C. and about 950° C. These temperatures can be generated by separate heating windings 11 and 12 in the respective zones. The respective temperature conditions, as a function of the dimension x of the heating device, are illustrated in FIG. 3. As can be seen from the radiation temperature profile of the diagram in FIG. 3, a transition zone, 14, is formed between the two heating zones 9 and 10. This transition zone, 14, is also shown in FIG. 2. In transition zone, 14, the temperature T increases from the temperature level $T_1$ of the zone 9 to the higher temperature level $T_2$ of the zone 10. The maximum of the positive temperature gradient $\Delta T/\Delta x$, in zone, 14, measured in the direction of motion, should be at least 5 K/mm, preferably at least 10 K/mm and most preferably, at least 50 K/mm.

As further shown in FIG. 2 by lines with arrows, an atmosphere, generally by flowing $O_2$, is formed in the working zone 8. The $O_2$-loading of the preliminary product, for adjusting the exact $O_2$ stoichiometry of the desired superconducting high-$T_c$ phase, however, can also take place in a process step following the heat treatment.

The preliminary product V is moved through the transition zone 14 at a predetermined velocity v which is between about 0.1 cm/sec and about 10 cm/sec and preferably between 0.5 cm/sec and 5 cm/sec. A temperature gradient field is thereby created having a maximum temperature gradient, of the above mentioned magnitude, over the preliminary product, in the direction of motion. Under the action of this gradient field, texturing of the crystal structure in the material of the preliminary product is promoted in such a manner that the planes of the crystals of the superconducting high-$T_c$ phase, which are responsible for the conduction of the current, come to lie largely parallel to the surface of the substrate or the preliminary product.

In this example the preliminary product is moved, after deposition on the substrate through the transition zone 14, already at the elevated temperature level with the predetermined temperature gradient $\Delta T/\Delta x$ during a heating-up phase of the heat treatment step. However, it is possible the promotion of an alignment of the anistropic crystal structures in the preliminary product may also be achieved, if the preliminary product is first subjected to a heat treatment in a manner generally known to those in the art. This heat treatment can be followed, as a thermal post-treatment, by the heat treatment according to the invention to create the temperature gradient. In this case, the structure present prior to this thermal post-treatment of the coated substrate should be considered the preliminary product, in accordance with the foregoing description.

I claim:

1. In a method for producing a layer of a metal-oxide superconductor with a high transition temperature in which first a layer of a metal-oxide precursor, still containing faults with respect to the metal-oxide superconductor to be developed, is applied to a substrate and subsequently a desired superconducting metal oxide phase, with an at least partially ordered crystal structure, is formed by means of a heat and oxygen treatment, where the crystal structure is anisotropic and cause a critical current density of the layer which is greater in a direction parallel to the surface of the layer than in a direction normal to the surface of the layer, the improvement comprising: moving the metal-oxide precursor coated on the substrate at a predetermined velocity, in a direction parallel to the surface of the layer, through a heated zone having a first section with a temperature $T_1$ of between about 350° C. and 550° C. and a second section with a temperature $T_2$ of greater than about 550° C. wherein $T_2$ is at least about 200° greater than $T_1$, to form a positive temperature gradient, measured in the direction of motion of the metal-oxide precursor of at least 5 K/mm.

2. The method of claim 1 wherein the temperature gradient is at least about 10 K/mm.

3. The method of claim 2 wherein the temperature gradient is at least about 50 K/mm.

4. The method of claim 1 wherein the heat and oxygen treatment further comprises a heating-up phase and the metal-oxide precursor is moved through the heated zone during the heating-up phase.

5. The method of claim 1 wherein the heat and oxygen treatment further comprises a plurality of heat treatments and the metal-oxide precursor is moved through the heat zone after a first heat treatment of the plurality of heat treatments.

6. The method of claim 1 wherein the heat and oxygen treatment further comprises an oxygen-containing atmosphere formed in the heated zone.

7. The method of claim 6 wherein the heat and oxygen treatment further comprises oxygen flowing through the heated zone.

8. The method of claim 1 wherein the predetermined velocity is between about 0.1 cm/sec and about 10 cm/sec.

9. The method of claim 8, wherein the predetermined velocity is between about 0.5 cm/sec and about 5 cm/sec.

10. The method of claim 1 wherein the metal-oxide superconductor is Me1-Me2-Cu-O, where Me1 comprises a rare earth metal and Me2 comprises an alkaline earth metal.

11. The method of claim 1 wherein $T_1$ is between about 400° C. and about 500° C.

12. The method of claim 1 wherein $T_2$ is above about 650° C.

13. The method of claim 12 wherein $T_2$ is above about 750° C.

14. The method of claim 11 wherein $T_2$ is above about 650° C.

15. The method of claim 11 wherein $T_2$ is above about 750° C.

* * * * *